(12) United States Patent
Sekine

(10) Patent No.: US 8,754,974 B2
(45) Date of Patent: Jun. 17, 2014

(54) SOLID-STATE IMAGING DEVICE

(75) Inventor: Hirokazu Sekine, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 84 days.

(21) Appl. No.: 13/421,230

(22) Filed: Mar. 15, 2012

(65) Prior Publication Data

US 2013/0069119 A1 Mar. 21, 2013

(30) Foreign Application Priority Data

Sep. 16, 2011 (JP) ................................. 2011-202814

(51) Int. Cl.
*H04N 5/335* (2011.01)

(52) U.S. Cl.
USPC ............ 348/308; 348/302; 348/294; 348/315

(58) Field of Classification Search
USPC ......... 348/273, 294, 300, 301, 302, 308, 315; 257/72, 225, 233, 239, 291–292; 250/208.1; 438/380
See application file for complete search history.

(56) References Cited

U.S. PATENT DOCUMENTS

| | | | |
|---|---|---|---|
| 6,091,449 A | 7/2000 | Matsunaga et al. | |
| 6,091,499 A * | 7/2000 | Abraham et al. | 356/623 |
| 6,107,665 A * | 8/2000 | Oike | 257/391 |
| 6,657,665 B1 * | 12/2003 | Guidash | 348/308 |
| 2003/0010981 A1 * | 1/2003 | Sekine | 257/72 |
| 2005/0269609 A1 * | 12/2005 | Henderson | 257/292 |
| 2007/0019086 A1 * | 1/2007 | Yoshida et al. | 348/272 |
| 2007/0091192 A1 * | 4/2007 | Hua et al. | 348/302 |
| 2008/0105909 A1 * | 5/2008 | Ham et al. | 257/292 |
| 2008/0124884 A1 * | 5/2008 | Pelella et al. | 438/380 |
| 2009/0173974 A1 * | 7/2009 | Shah et al. | 257/292 |
| 2011/0007197 A1 * | 1/2011 | Masuyama | 348/296 |
| 2011/0176023 A1 * | 7/2011 | Jung et al. | 348/222.1 |

FOREIGN PATENT DOCUMENTS

| | | |
|---|---|---|
| JP | 2006-302970 | 11/2006 |
| JP | 2011-517506 | 6/2011 |

OTHER PUBLICATIONS

Office Action mailed Jan. 21, 2014 in Japanese Application No. 2011-202814 filed Sep. 16, 2011 (w/English translation).

* cited by examiner

*Primary Examiner* — Nhan T Tran
*Assistant Examiner* — Xi Wang
(74) *Attorney, Agent, or Firm* — Oblon, Spivak, McClelland, Maier & Neustadt, L.L.P.

(57) ABSTRACT

Provided is a solid-state imaging device. Two unit cells are prepared each having three pixels and sharing an output circuit. One of the basic blocks is rotated by 180° such that a reset drain is shared, resulting in a 6-pixel 1-cell, and the cells are disposed in a square lattice pattern or checkerboard pattern. Thus, element isolation regions between the pixels and the output circuit disposed adjacent thereto are minimized, and the number of wirings disposed around the pixels is reduced. As a result, a margin for white scratches and saturation charge amounts may be increased despite the miniaturization of cells.

20 Claims, 11 Drawing Sheets

SOLID-STATE IMAGING DEVICE

CROSS REFERENCE TO RELATED APPLICATIONS

This application is based upon and claims the benefit of priority from the prior Japanese Patent Application No. 2011-202814 filed in Japan on Sep. 16, 2011; the entire contents of which are incorporated herein by reference.

FIELD

The present invention relates to a solid-state imaging device in which the integration density of pixels is improved.

BACKGROUND

A 2-pixel 1-cell type structure is well known as a cell structure of a conventional CMOS sensor-type solid-state imaging device. The 2-pixel 1-cell structure is a so-called shared pixel-type in which two photodiodes (hereinafter referred to as PDs) are provided to accumulate charges generated by photoelectric conversion and an output circuit to convert signal charges read from the PDs into a voltage is shared by the two PDs. Typical examples of the shared-pixel-type structure are described in U.S. Pat. No. 6,091,449 or Japan Patent Publication 2006-302970 filed by the present applicant.

A solid-state imaging device of the 2-pixel 1-cell type include PDs, a floating junction (hereinafter referred to as an FJ) configured to transfer charges from the PDs, transfer gate transistors (hereinafter referred to as TGs) configured to control the transfer the charge of the floating junction, an output amplifier transistor (hereinafter referred to as an Amp) configured to detect a variation in potential of the FJ, a gate electrode of a reset transistor (hereinafter referred to as an RS) configured to reset the potential of the FJ to a constant potential before the charges from the PDs are transferred to the FJ, and a reset drain electrode (hereinafter referred to as an RD) serving as a reset potential of the RS and a power source of the Amp. An output source electrode (hereinafter referred to as an OS), which is configured to externally output a variation in potential of the gate electrode connected to the FJ, is provided at a side of a source electrode of the Amp.

Thus, each PD includes a TG configured to transfer charges, and two PDs share the FJ, the RS, the Amp, and the RD may be shared by the two PDs. Thus, element isolation regions increase since the above-described components are provided around each PD. Typically, the number of transistors of the 2-pixel 1-cell type structure includes two TGs, one RS, and one Amp, and thus two transistors are required for each PD. Further, with respect to the number of wirings, there are two TG wirings, one RS wiring, one RD wiring, and one output wiring (connected to an OSL) for two PDs, in a 2-pixel 1-cell type structure in which 2 PDs are arranged in a vertical direction. Thus, one TG wiring (horizontal direction), 0.5 RS wiring (horizontal direction) and RD wiring (horizontal direction), and one output wiring (vertical direction) are required for each PD.

Regarding the element isolation region, since element isolation is necessary between a PD and a transistor in typical fine cells, the isolation is made in a structure which is referred to as shallow trench isolation (hereinafter referred to as STI). This is a method of forming a shallow groove (trench) in a semiconductor substrate to form an isolated structure by burying an oxide layer in the shallow trench. To prevent image deterioration (white scratches) caused by damage applied when forming the trench in the semiconductor substrate, designs in which an impurity region is prepared around the trench such that a depletion layer from the PDs does not reach a damaged region are being proposed. While the providing of the impurity region contributes to image quality improvement, an effective area of the PD is reduced. In addition, charges that may be accumulated in the PDs (hereinafter referred to as saturation charges) may be reduced when the fine patterning of pixels is performed.

Meanwhile, an increase in the number of wirings has led to a lowering of effective collection of light incident to the PDs, thus causing shading deterioration even in a screen peripheral portion. Similarly, these problems have resulted in image deterioration along with the finer patterning of the cells.

DETAILED DESCRIPTION

Figure 1:
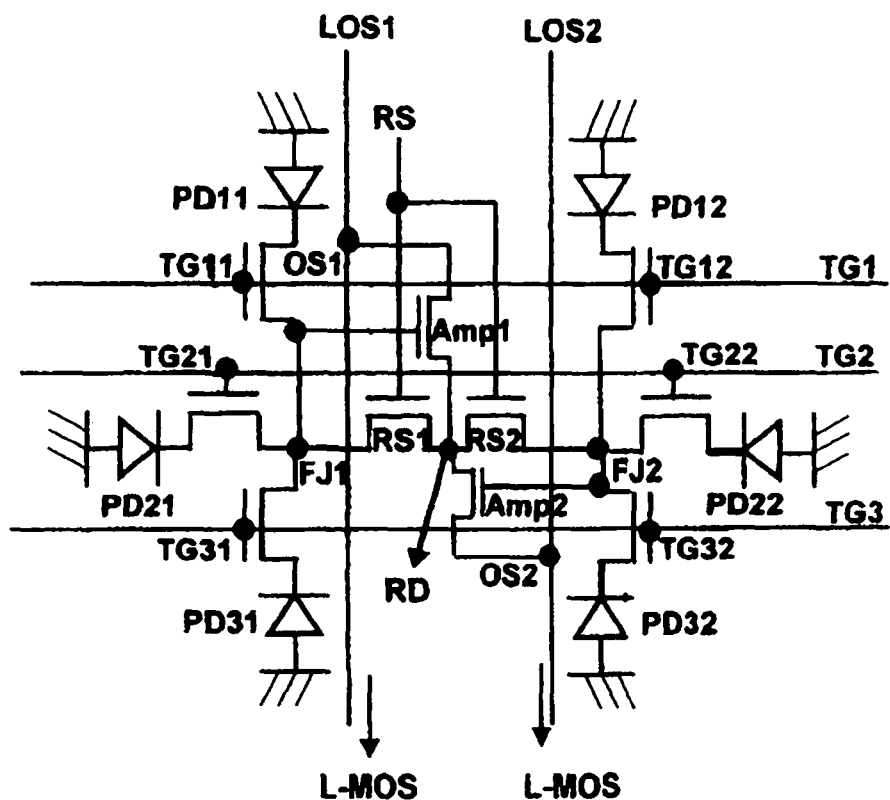
FIG. 1 is a circuit diagram of a 6-pixel 1-cell unit cell which composes a solid-state imaging device according to an embodiment.

A certain embodiment provides a solid-state imaging device including: photodiodes configured to convert incident light into signal charges and accumulate the signal charges; transfer gate transistors configured to read signal charges from the photodiodes; floating junctions configured to receive the signal charges from the transfer gate transistors and generate variations in potentials; amplifier transistors provided to detect the variations in potentials of the floating junctions and having a gate electrode, a drain electrode, and an output source electrode; and reset transistors provided to reset the potentials of the floating junctions to a constant potential and having a source electrode as the floating junction, a reset gate electrode, and a reset drain electrode forming a power source unit to specify the constant potential. Each of the floating junctions and the reset drain electrodes of the reset transistors is formed in a rectangular pattern. Transfer gate electrodes of the transfer gate transistors are disposed adjacent to three sides of the rectangular pattern forming the floating junction. Three photodiodes are disposed on opposite sides of the floating junctions of transfer gate electrodes one by one. The gate electrode of the reset transistor is disposed adjacent to the remaining side of the floating junction. The reset drain electrode having the rectangular pattern is disposed on opposite sides of the floating junctions of the gate electrode. The gate electrode of the amplifier transistor is disposed adjacent to one side of the reset drain electrode having the rectangular pattern. The output source electrode of the amplifier transistor is disposed on the opposite side of the reset drain electrode of the gate electrode. In addition, the three photodiodes are read in a common output circuit including the floating junctions, the reset transistor, and the amplifier transistor. A basic block in which the reset drain electrode of the reset transistor and the drain electrode of the amplifier transistor are common are configured. Two basic blocks are prepared. One of the basic blocks is rotated by about 180° about the reset drain electrode such that the reset drain of the two basic blocks is shared, the basic blocks are combined, and a basic unit cell includes six photodiodes.

A solid-state imaging device according to an embodiment of the present invention is a complementary-metal-oxide-semiconductor (CMOS) sensor in which a 6-pixel 1-cell is used as a block and a 12-pixel 1-cell is repeatedly disposed as a unit in a checkerboard pattern. By sharing an output circuit between a plurality of PDs, the length of shallow trench isolation (STI) regions disposed adjacent to the PDs may be reduced. Thus, white scratches may be prevented even in fine cells, a saturation charge amount may be ensured, and the number of wirings for one PD may be reduced, since the element isolation of the PDs from one another is mostly implemented in an ion implantation region. Thus, shading deterioration can be prevented.

Hereinafter, a solid-state imaging device according to embodiments of the present invention will be described in detail with reference to the drawings.

First Embodiment

FIG. 1 is a circuit diagram of a basic cell which configures a solid-state imaging device according to a first embodiment. Six photodiodes (PDs) PD11, PD12, PD21, PD22, PD31, and PD32 are divided into two groups disposed on left and right sides. Left PD11, PD21, and PD31 are connected to a floating junction FJ1 via transfer gate transistors TG11, TG21, and TG31. Right PD12, PD22, and PD32 are connected to FJ2 via TG12, TG22, and TG32. FJ1 and FJ2 are connected to a common reset drain terminal RD at left and right sides via reset transistors RS1 and RS2, respectively. Gates Amp1 and Amp2 of an output amplifier transistor Amp are vertically connected to a common drain, which also serves as RD. FJ1 and FJ2 are connected to the gates Amp1 and Amp2, respectively, and variations in potentials of FJ1 and FJ2 are output from output source electrodes OS1 and OS2 to the outside. OS1 and OS2 are connected to output signal lines LOS1 and LOS2 extended in a vertical direction, respectively. Although no circuit is illustrated, load MOSs (L-MOSs) are disposed before LOS1 and LOS2. Further, TG11 and TG12 disposed on the same horizontal line are connected to a readout line TG1. Similarly, TG21 and TG22 are connected to a readout line TG2, and TG31 and TG32 are connected to a readout line TG3. FIG. 1 illustrates a structure in which one RD is shared among six pixels, which will now be referred to as a 6-pixel 1-cell structure.

Figure 2:
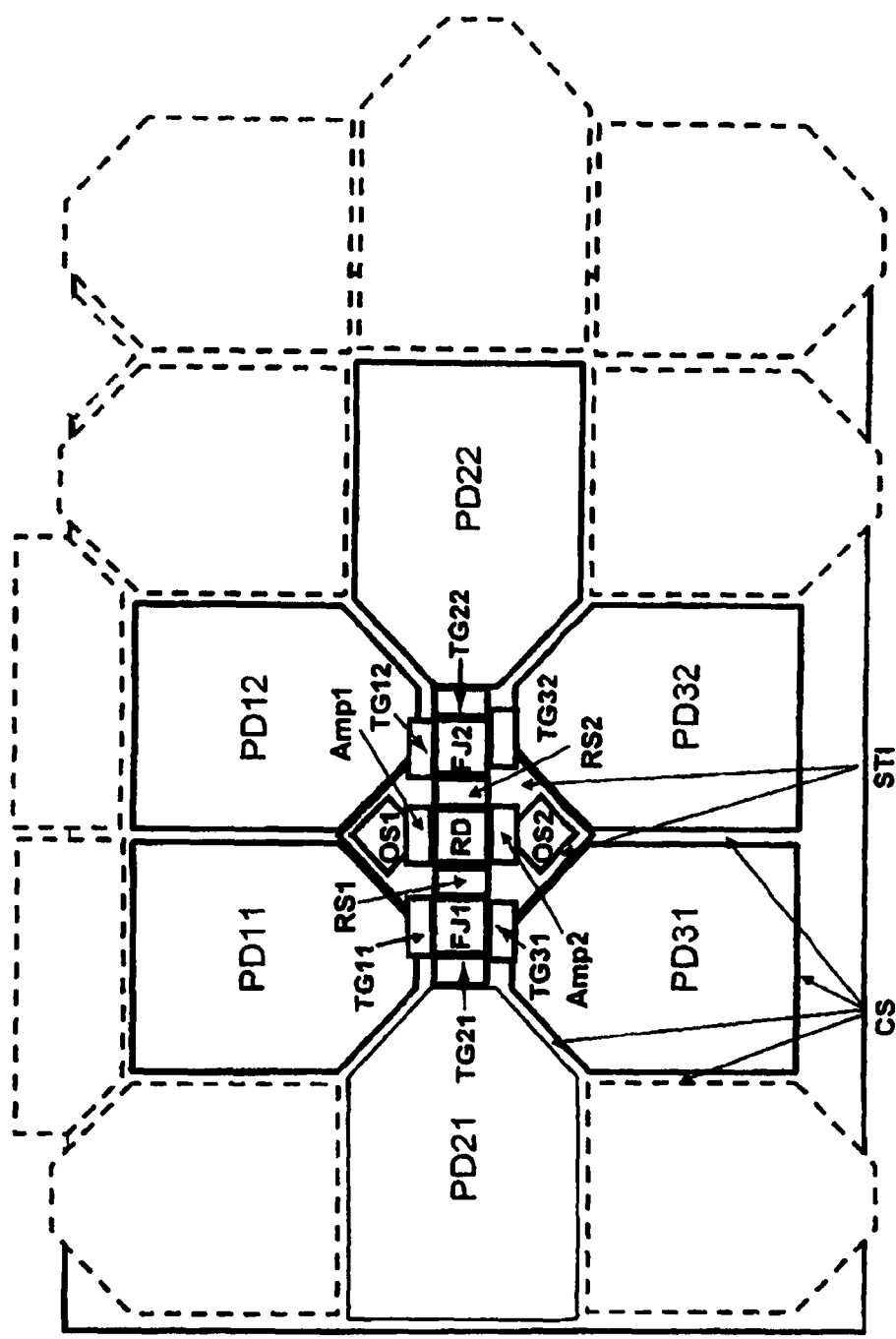
FIG. 2 is a plan view illustrating a pattern layout of the 6-pixel 1-cell unit cell illustrated in FIG. 1.

A layout of a circuit of a basic cell illustrated in FIG. 1 is illustrated in FIG. 2. The layout of FIG. 2 is characterized in that TG11, TG21, and TG31 are disposed on three of four sides of FJ1 and PD11, PD21, and PD31 are disposed before TG11, TG21, and TG31, respectively. RS1 is disposed adjacent to the one remaining side of FJ1, and RD is disposed at a drain side of RS1, which is disposed opposite to FJ1. An additional 3-pixel 1-cell is disposed by rotating a 3-pixel 1-cell block by 180° about RD in a horizontal direction. That is, RS2 is disposed at a position opposite to RS1 at RD. FJ2 is disposed on a side of RS2 opposite to RD. Thus, TG12, TG22, and TG32 are disposed on three of four sides of FJ2, and PD12, PD22, and PD32 are disposed before TG12, TG22, and TG32, respectively. Meanwhile, the gates Amp1 and Amp2 of the output amplifier transistor Amp are respectively disposed adjacent to upper and lower sides of a RD. Amp1 and Amp2 are connected to FJ1 and FJ2, respectively (connection lines are not shown). The source electrodes OS1 and OS2 are disposed at source sides of Amp1 and Amp2, and the output signal lines LOS1 and LOS2 (not shown) are connected to OS1 and OS2 and extended in a vertical direction.

Element isolation between the PD and the OS of output circuits may be performed by an STI. Meanwhile, the element isolation between the PDs may be performed by impurity regions (hereinafter referred to as a channel stopper (CS)) formed by an ion implantation method.

Figure 3:
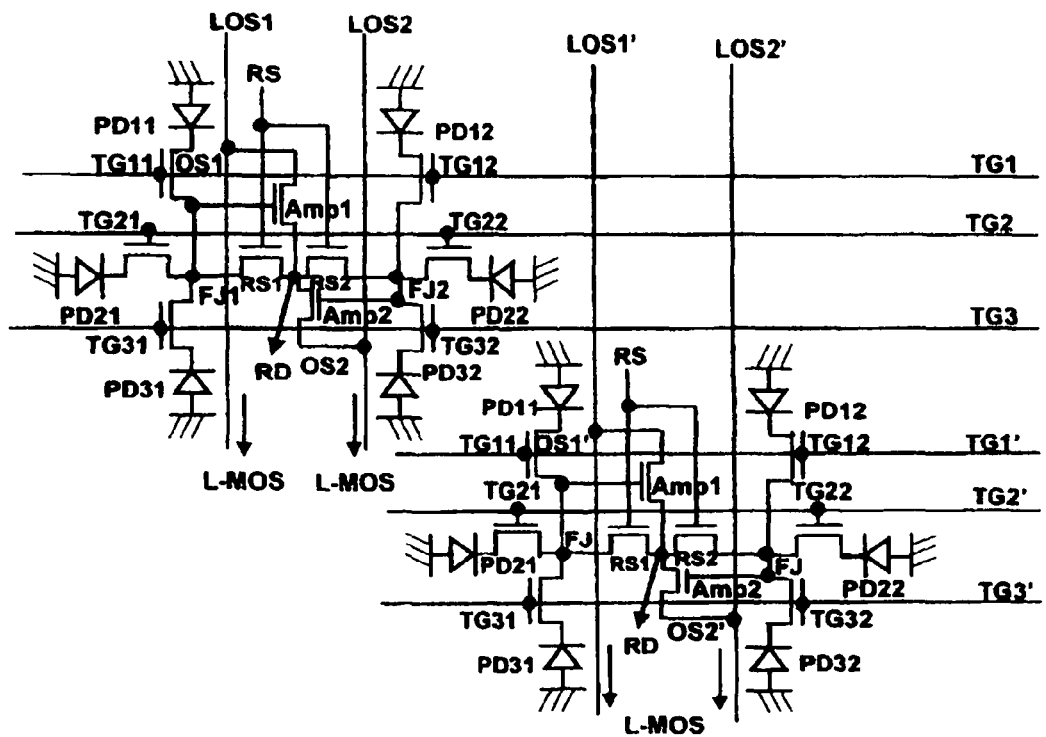
FIG. 3 is a circuit diagram of a 12-pixel 1-cell unit cell in which two blocks of unit cells illustrated in FIG. 1 are combined.

In the layout of the 6-pixel 1-cell illustrated in FIG. 2, when considering arrangement of an adjacent cell, it is more preferable for the cell to be arranged to be shifted in an inclined direction, than to be arranged in a square lattice shape. This practical arrangement structure will now be described with reference to the equivalent circuit diagram of FIG. 3. FIG. 3 is a circuit diagram in which the 6-pixel 1-cell of FIG. 1 is defined as one block and two blocks are adjacent in an inclined direction. The structure of FIG. 3 becomes a so-called 12-pixel 1-cell type equivalent circuit. Here, PD11 and PD12 of a second block are arranged on the same horizontal line to be adjacent to PD31 and PD32 of a first block. A readout line TG and an output source electrode OS of the second block are respectively indicated by TG1' and OS1' to be distinguished from those of the first block.

Figure 4:
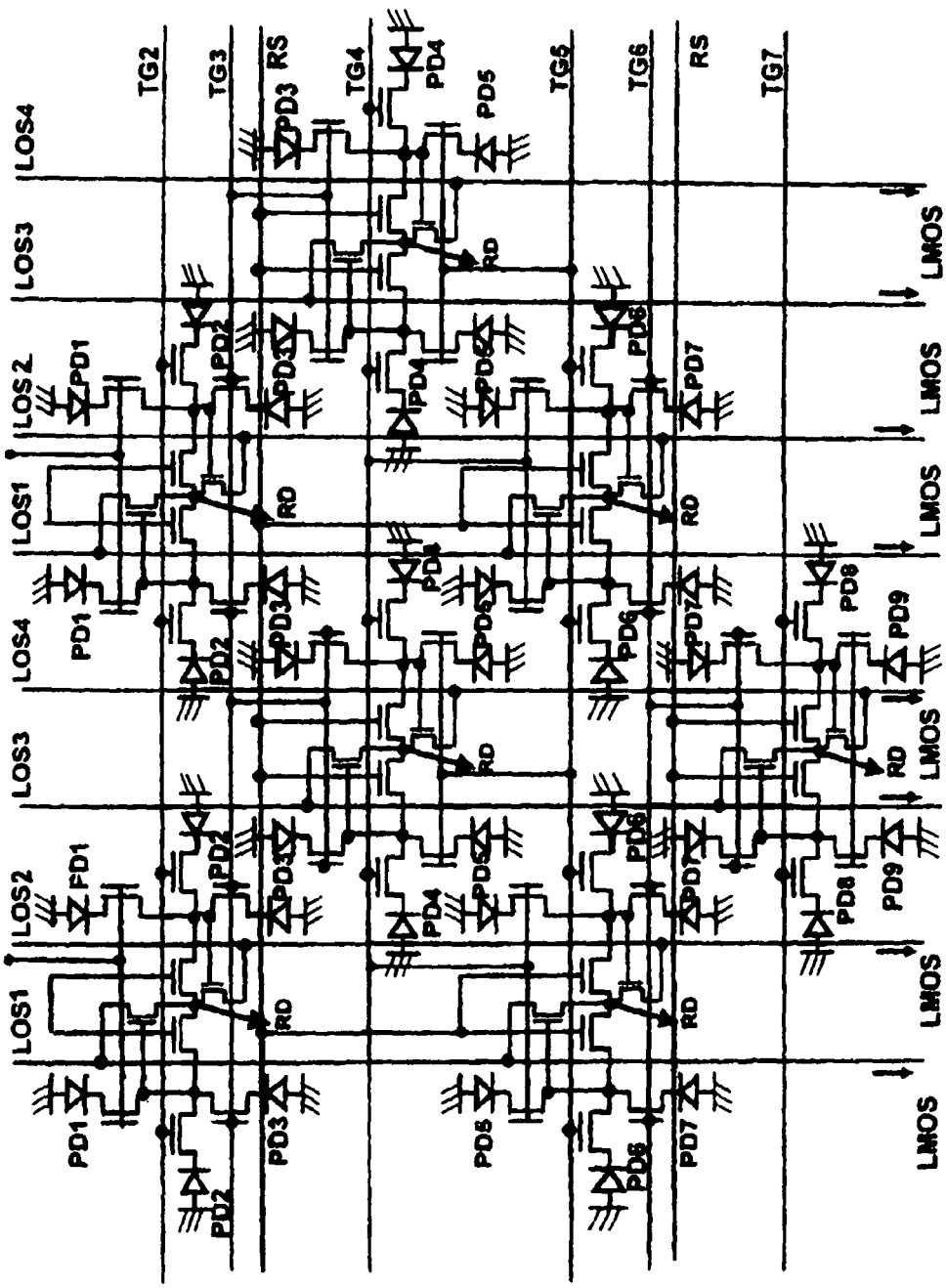
FIG. 4 is a circuit diagram of a solid-state imaging device obtained by repeatedly arranging the 12-pixel 1-cell unit cell illustrated in FIG. 3.

A circuit obtained by repeatedly disposing the 12-pixel 1-cell of FIG. 3 is illustrated in FIG. 4. In FIG. 4, PDs disposed on the same horizontal line are indicated by the same reference numeral. For example, PD11 and PD12 will be referred to as PD1. In FIG. 3, PD11 and PD12 of the second block are disposed adjacent to PD31 and PD32 of the first block. On the other hand, in FIG. 4, PDs are on the same line and indicated by PD3. Accordingly, TG3 and TG1' are at the same read timing and indicated by TG3, and TG2' and TG3' of the second block are indicated by TG4 and TG5, respectively. TG5 is on the same wiring as TG1 of a third block. Serially, wirings corresponding to TG2 and TG3 of the third block are TG6 and TG7, respectively, and TG7 corresponds to TG1' of a fourth block. The equivalent circuit illustrated in FIG. 4 is characterized in that TGs are opened such that two blocks adjacent in the inclined direction are always set and the output circuit is turned on. Accordingly, RSs are wired so that RSs of the two blocks are reset in common. Further, the output signal lines OS1' and OS2' of FIG. 3 are respectively indicated by OS3 and OS4 in the image of the 12-pixel 1-cell layout in FIG. 4.

Figure 5:
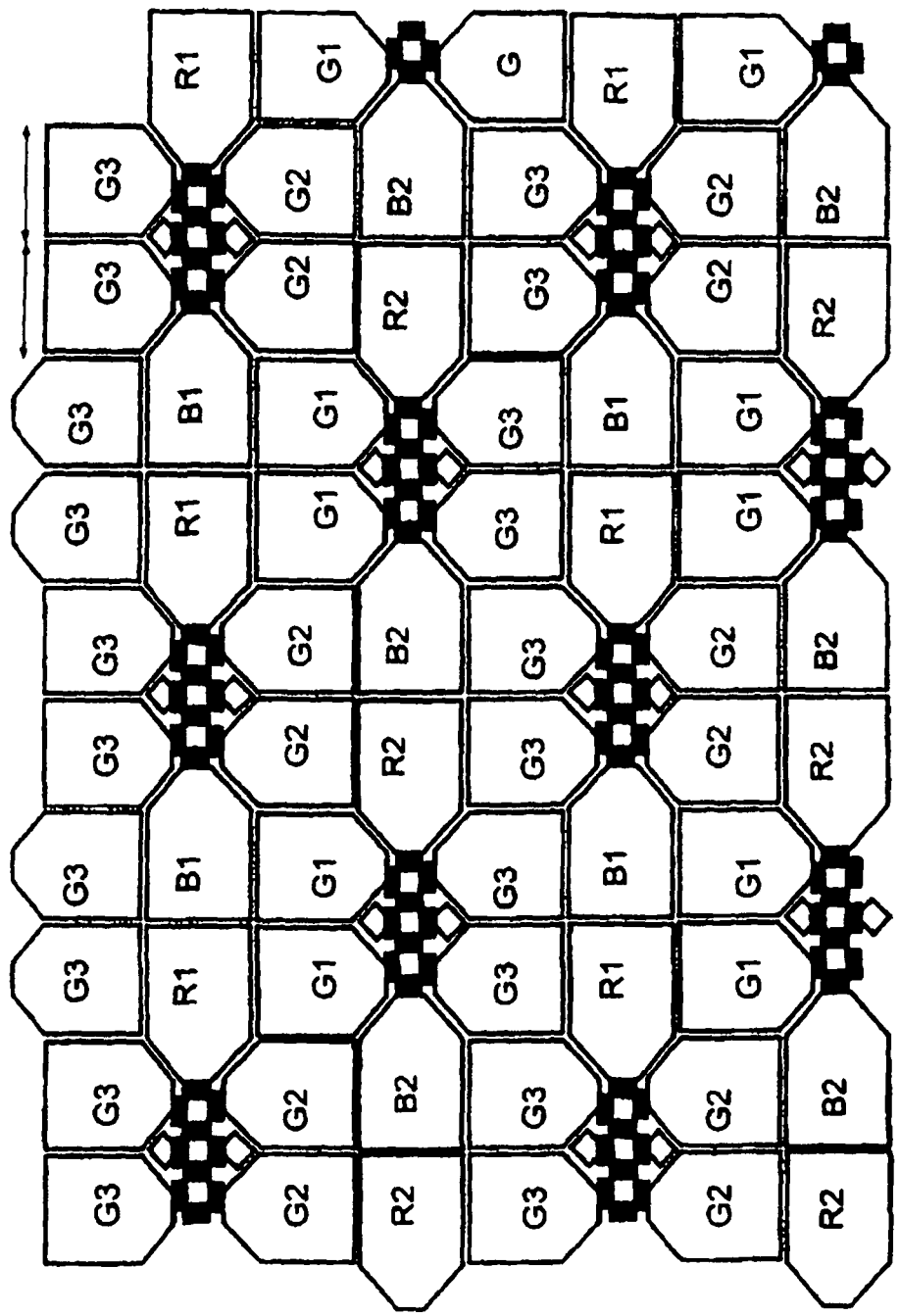
FIG. 5 is a plan view illustrating a pattern layout of the solid-state imaging device illustrated in FIG. 4 along with arrangement of color filters.

A layout of the equivalent circuit diagram illustrating the repetition of the 12-pixel 1-cell of FIG. 4 is illustrated in FIG. 5. FIG. 5 also illustrates an example of arrangement of color filters. The color filters are arranged such that the number of green pixels having a high luminance component ratio is increased, and each of the numbers of red and blue pixels to generate color signals is limited to ½ the number of the green pixels based on the fact that the human eyes have a lower color resolution for red and blue.

PDs that are simultaneously read by the output circuits of the two blocks disposed adjacent to each other in an inclined direction are expressed by adding numbers 1, 2, and 3 of read information next to characters R, G, and B indicating color information of the color filters. That is, in pixels on adjacent vertical lines indicated by the same reference numeral, read signals are applied and read by the same wiring TG as illustrated in FIG. 4 at the same time. The above-described expression applies likewise to the following drawings.

Figure 6:
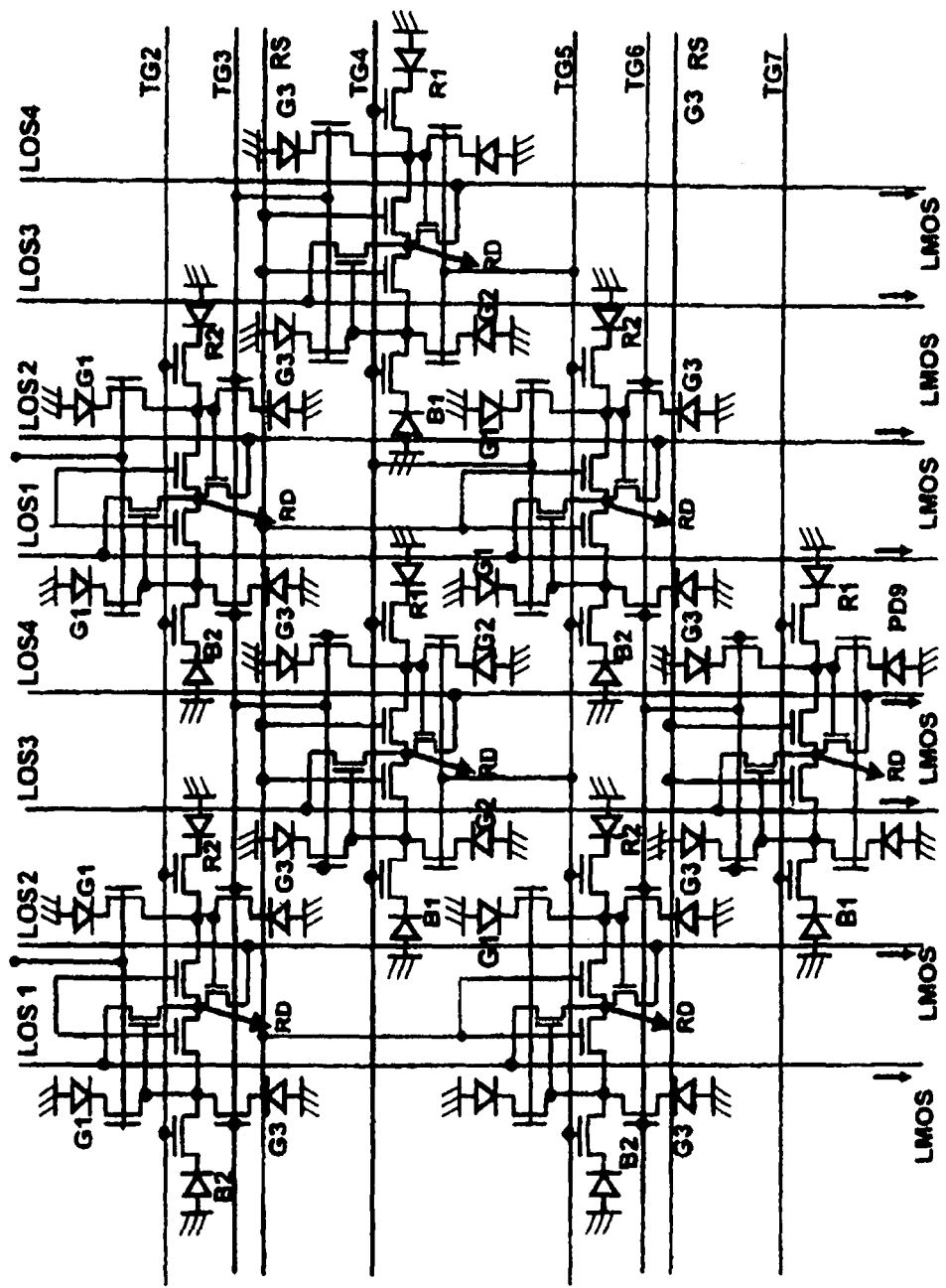
FIG. 6 is a circuit diagram in which color information and readout information are added to the circuit diagram illustrated in FIG. 4.

FIG. 6 is a diagram in which the color information and the read information shown above are added to the PDs of the equivalent circuit diagram of FIG. 4 corresponding to the layout of FIG. 5.

Next, characteristics of the imaging device according to the present embodiment that were described with reference to FIGS. 2 to 6, which are not included in a conventional imaging device, will be described. In the 6-pixel 1-cell structure of FIG. 2, which is a basic block of the imaging device according to the present embodiment, transistors include six TGs, two RSs, and two Amps, resulting in a 6-pixel 10-transistor structure. Accordingly, there are 1.67 transistors for one pixel (PD). Also, since RD is shared, there is one RD for six pixels. Accordingly, since the occupied area of the RD is reduced, an occupied area ratio of a PD for one cell is increased.

In addition, the imaging device is also characterized by the arrangement of pixels, in which six pixels are disposed to surround the output circuit. Although portions of adjacent PDs are illustrated with dotted lines, three orthogonal sides of one PD are disposed adjacent to another PD, a portion of one remaining side is disposed adjacent to TG or another PD, and the remaining portion is disposed adjacent to the output circuit. In the figure, the remaining side of the PD is separated into three sides that cross one another at obtuse angles and are respectively disposed adjacent to PD, TG, and the shallow trench isolation (STI) region of OS of the output circuit. Since the three orthogonal sides of one PD are in contact with the adjacent PD as describe above, element isolation between the adjacent PDs can be performed in an impurity region formed by an ion implantation method.

This will be further described in detail. Since peripheral potentials may affect signal levels in the output circuit, it is necessary to reinforce element isolation, and STI is used for element isolation. However, when the element isolation between the PDs is performed, since it is intended to form walls of potential wells of the PDs, a variation in the height of the walls does not affect a photoelectric conversion operation or accumulation of signal charges in a normal imaging state. Although excessive charges are likely to leak into adjacent PDs due to a saturated state, the excessive charges may be allowed to flow into FJ by controlling a potential of TG to a closed state (slightly opening TG). Thus, the excessive charges may be drained to an RD by opening the reset transistor RS immediately before reading the signal charges, thereby suppressing image-quality deterioration.

Next, merits of a structure in which the PDs are isolated from adjacent elements without using an STI technique will be described. As explained in Background of the Invention, due to an STI-related problem of a trade-off relationship between white scratches and a saturation charge amount, characteristics of a device have been degraded within a large range according to miniaturization. In particular, since the deterioration of the device characteristics may adversely affect white scratches, loads may be applied to peripheral circuits to compensate for the scratches on a large scale, thus resulting in formation of unnatural images. In contrast, according to the present embodiment, since element isolation may be formed using only an ion implantation process, damage to a semiconductor substrate may be easily recovered using thermal treatment (annealing). Accordingly, since an element isolation process causing little damage is realized, a white scratch margin is greatly improved. Also, an element isolation width may be determined by a missing pattern of a resolution limit. Thus, a reduction in the effective area of the PDs may be suppressed so that a reduction in the saturation charge amount of the PDs can also be suppressed.

As another feature of the imaging device according to the present embodiment, a pixel pitch is determined to be almost a size of the PD to facilitate miniaturization. Also, since a distance between FJ1 and Amp1 (and a distance between FJ2 and Amp2) is short, a wiring length may be reduced, so that a parasitic capacitance of the floating junction FJ may be reduced to increase an amplifier gain.

Second Embodiment

Figure 7:
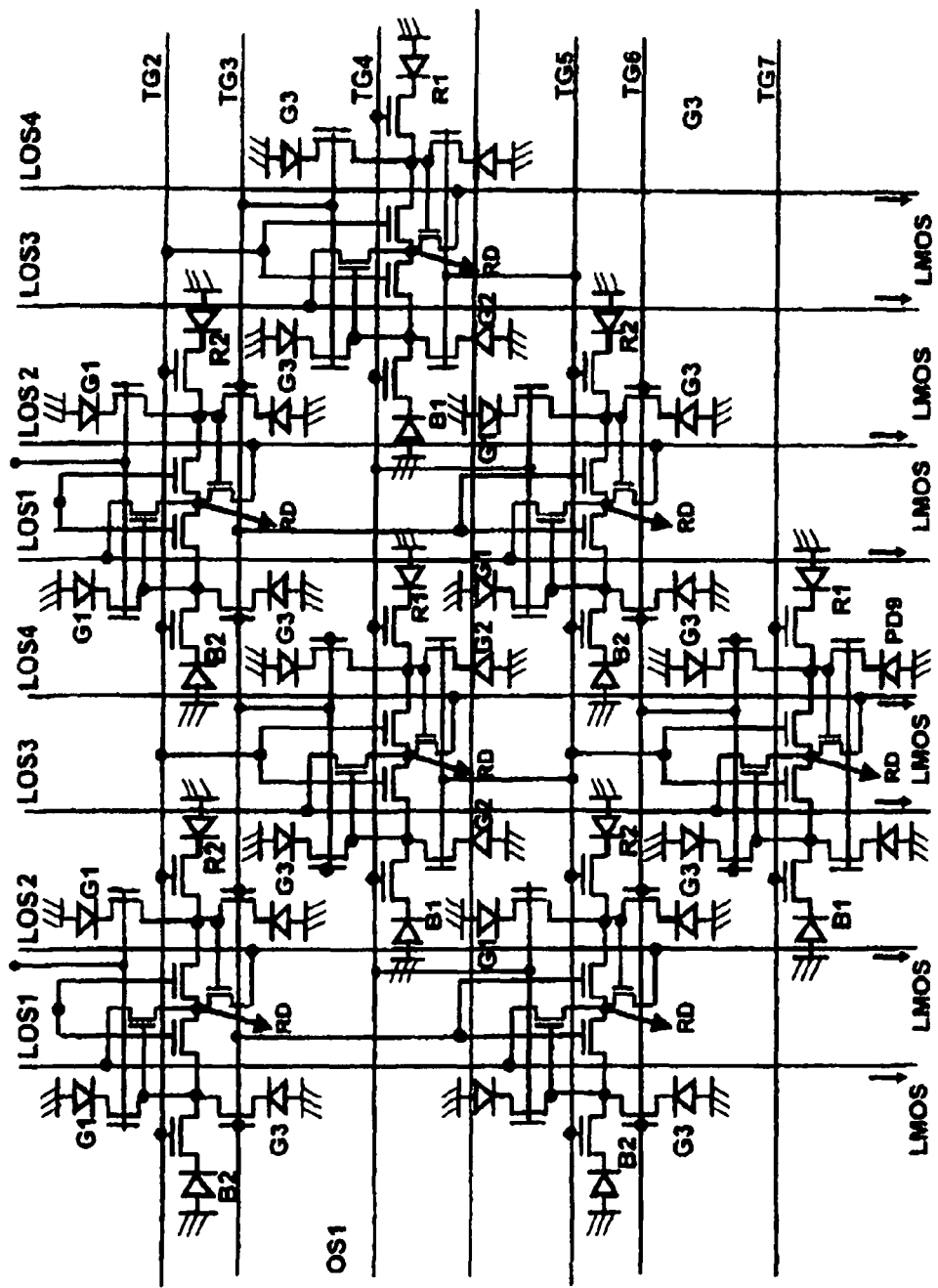
FIG. 7 is a circuit diagram of a solid-state imaging device according to another embodiment.

FIG. 7 is a circuit diagram of a solid-state imaging device according to another embodiment of the present invention. In a circuit in which the 12-pixel 1-cell repetition illustrated in FIG. 6 is repeatedly arranged, a circuit diagram in which RS wirings are shared with TG wirings is shown. While signal charges are being read from PDs by applying a read pulse signal via the TG wirings, a reset operation of FJ may also be performed by sharing the same pulse with a reset transistor RS of the next output block, before signal charges are read from PDs of the next block.

Figure 8:
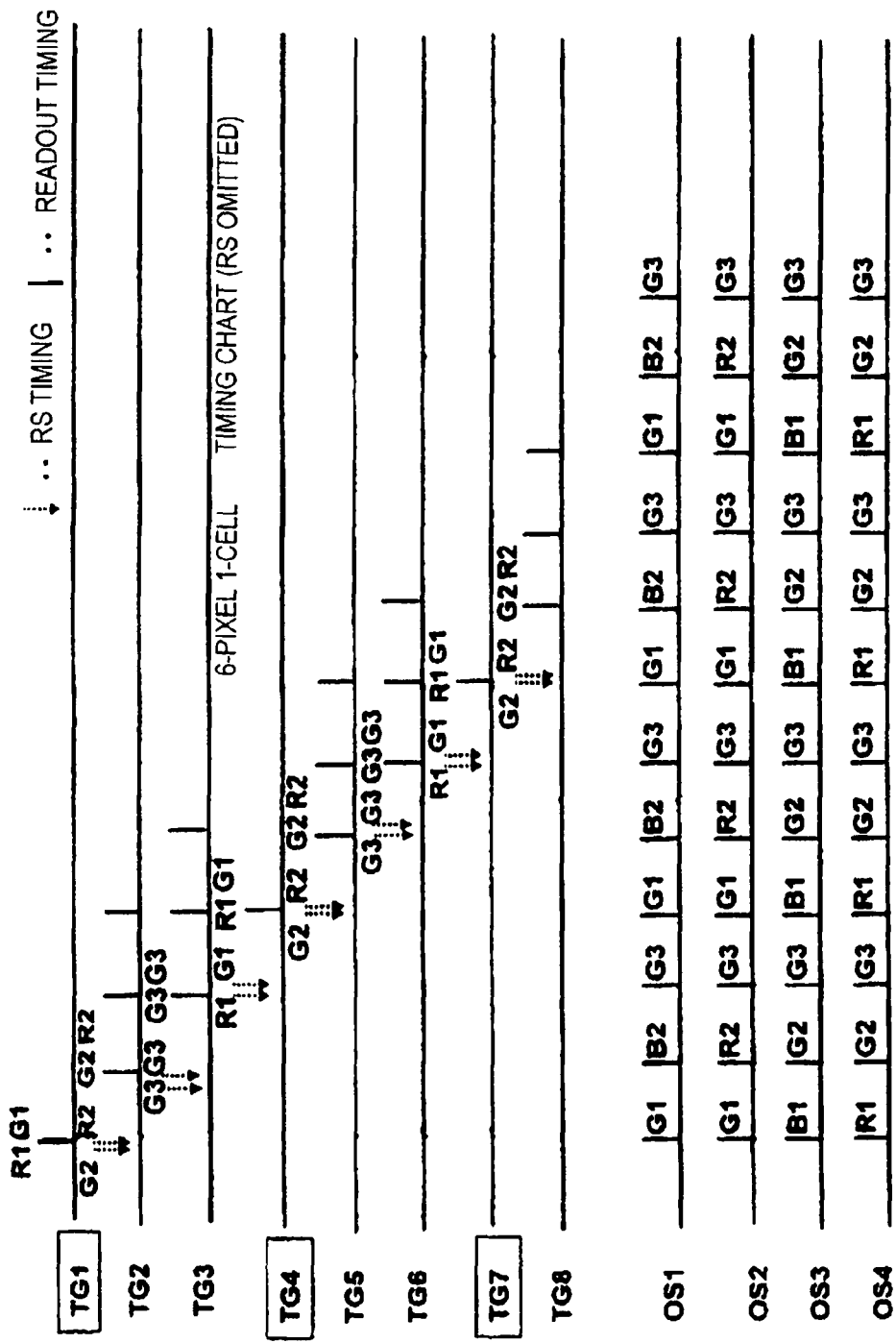
FIG. 8 is a timing chart for reading out a signal from the pixels of the solid-state imaging device illustrated in FIG. 7.

FIG. 8 illustrates a timing chart of a read pulse signal TG and a reset pulse signal RS in the equivalent circuit diagram of FIG. 7. In the figure, the read timing at TG is indicated by a solid line, and a timing to reset (RS) FJ of the next line of the read pulse signal TG at TG is indicated by a dotted line. Reference numerals R1 and G1 added on the solid and dotted lines indicate timing when FJ of circuit blocks configured to read pixels R1 and G1 at the timing of the dotted line are reset, indicating that reading is performed from PD to FJ with a read pulse signal at the timing of the solid line. Although pixels R1 and B1 are disposed on the same line from the layout, only pixels R1 are representatively illustrated in FIG. 8. To apply the reset pulse signal RS, the remaining pulse is applied after reading the read pulse signal TG. Four lines illustrated in a lower portion of FIG. 8 show color information of pixels and readout information output at timing of the read pulse signal TG on OS1, OS2, OS3, and OS4. These are the same as those added to pixels of FIG. 7.

Figure 9:
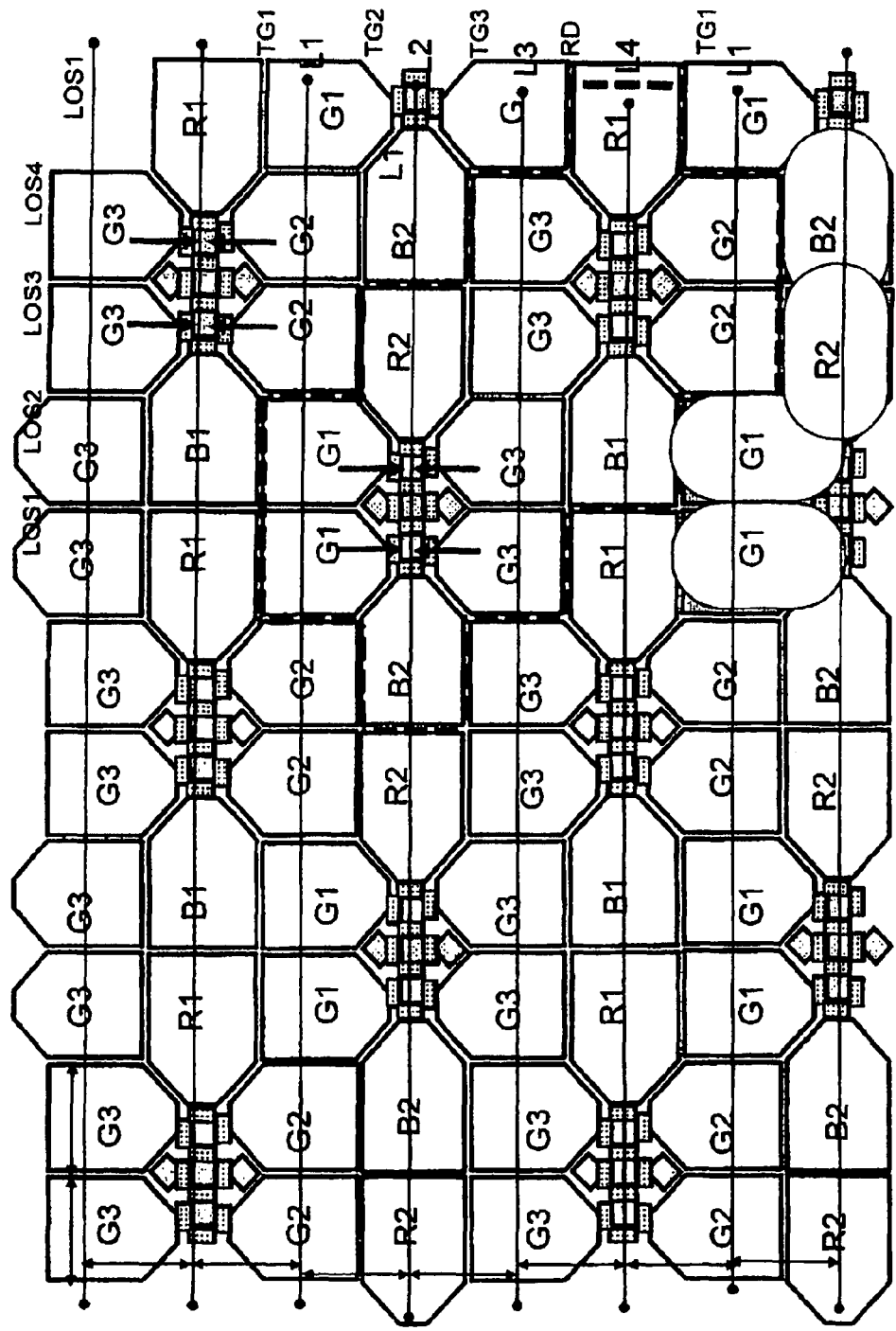
FIG. 9 is a plan view illustrating a pattern layout of a solid-state imaging device according to other embodiment.
Figure 10:
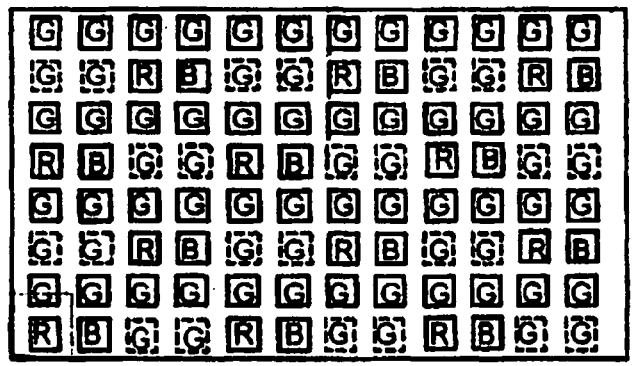
FIG. 10 is a plan view illustrating an arrangement of color filters applied to the pattern layout of the solid-state imaging device illustrated in FIG. 9.

FIG. 9 is a plan view illustrating a pattern layout of a solid-state imaging device according to another embodiment of the present invention. In FIG. 9, a layout in which the 12-pixel 1-cell illustrated in FIG. 5 is repeatedly arranged and horizontal scan lines are shown. In the arrangement of pixels, each of the numbers of R pixels and B pixels disposed on the same scan lines is half the number of G pixels disposed on the same scan line. This is because output circuits are disposed on lines of the R and B pixels. An example of a method of compensating for omission of pixels from portions of the output circuits will be described with reference to FIG. 9. That is, all pixels disposed adjacent to, above and below the output circuits are G pixels G3 and G3, and G2 and G2, which are averaged to obtain imaginary G (hereinafter referred to as Gr). Thus, the numbers of pixels disposed on the horizontal scan lines may be uniformized. The arrangement of color filters in each pixel buried by the imaginary Gr is illustrated in FIG. 10. Each of square shapes G surrounded with dotted lines in FIG. 10 is the imaginary Gr produced using the above method. Also, an example of a microlens shape is illustrated in a right lower portion of FIG. 9.

Next, an advantage of the embodiment will be described from the standpoint of the number of wirings with reference to FIG. 9. By use of the arrangement of FIG. 7 in which the readout wiring TG and the reset wiring RS are common, as illustrated in a right end of FIG. 9, four wirings TG1, TG2, TG3, and RD are repeatedly arranged in a horizontal direction. In addition, although not depicted in FIG. 9, the wirings TG1, TG2, TG3, and RD are arranged along spaces between the PDs. Also, four horizontal scan lines L1, L2, L3, and L4 are provided. In the 12-pixel 1-cell surrounded with a bold dotted line, a horizontal scan line passing through two lower pixels G2 and G2 is repeated in the same manner as a horizontal scan line passing through two upper pixels G1 and G1, resulting in a repetition of four pixels. Meanwhile, four output signal lines as indicated by LOS1, LOS2, LOS3, and LOS4 are arranged repeatedly in a vertical direction. In addition, although not depicted in FIG. 9, output signal lines LOS1, LOS2, LOS3, and LOS4 are arranged along the spaces between PDs. When four wirings are disposed in a horizontal direction for four horizontal scan lines, it means that one wiring is provided for one pixel in the horizontal direction. Similarly, four output signal lines are provided at intervals of four pixels in a vertical direction. This means that one wiring is provided for one pixel (PD) in the vertical direction. Thus, in the present invention, wirings are arranged around pixels in each of horizontal and vertical directions one by one.

Meanwhile, in a conventional 2-pixel 1-cell structure, there have been two TGs and one RD for two pixels in the horizontal direction, and one output wiring for one pixel in the vertical direction on the premise that a reset wiring RS and a readout wiring TG are common. Accordingly, 1.5 wirings are provided in the horizontal direction, and one output wiring is provided in the vertical direction for one pixel. In the present embodiment, on the contrary, reduction in the number of wirings improves the collecting efficiency of light incident to the PDs, thereby suppressing shading at a peripheral portion of the screen. These effects may be markedly increased with the miniaturization of cells.

Third Embodiment

Figure 11:
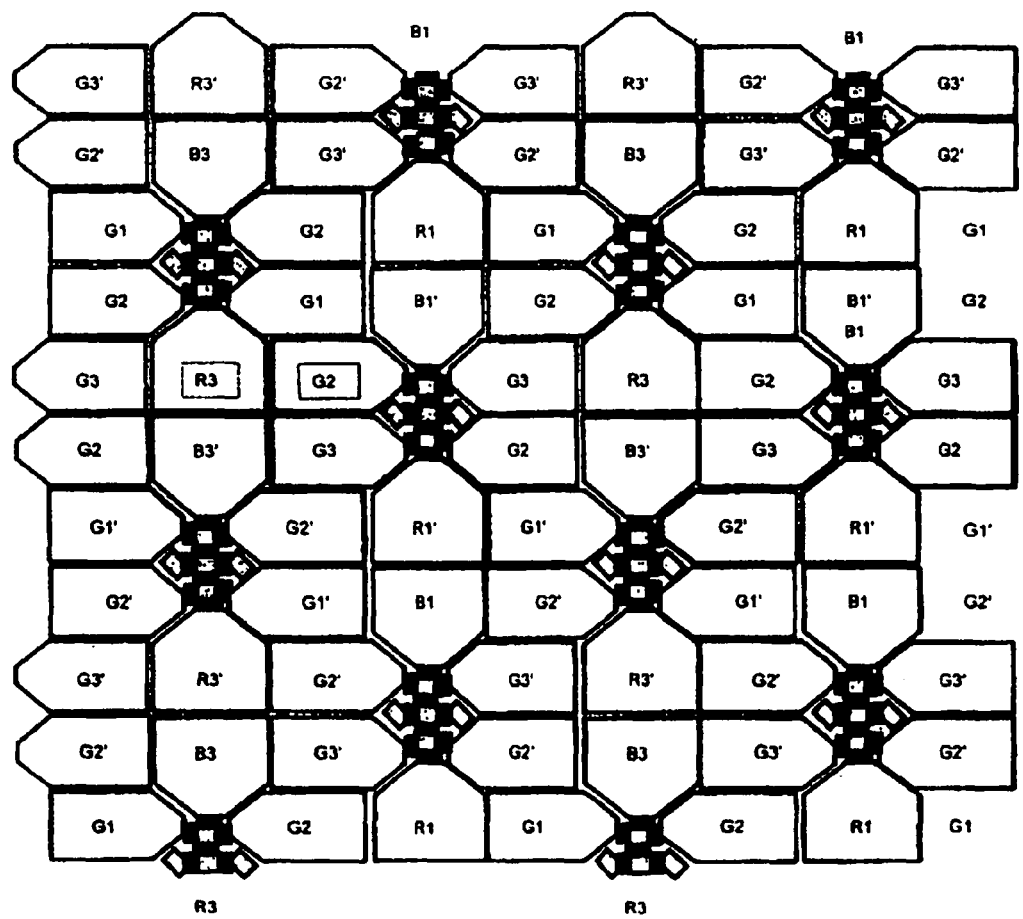
FIG. 11 is a plan view illustrating a pattern layout of a solid-state imaging device according to other embodiment.

FIG. 11 is a plan view illustrating a pattern layout of a solid-state imaging device according to another embodiment of the present invention. The pattern layout of the solid-state imaging device is a layout obtained by rotating the 12-pixel 1-cell repetition block illustrated in FIG. 5 by about 90°. Numbers 1, 2, 3, 1', 2', and 3' are added to characters R, G, and B indicating color of color filters to express reading out order of the pixels. The reading of the pixels is performed in a manner that four pixels (OS1, OS2, OS3, and OS4) are readout by two output circuits adjacent in an inclined direction, each of which reads out two pixels. As readout information, 1', 2', and 3' are added, in addition to conventional 1, 2, and 3.

Figure 12:
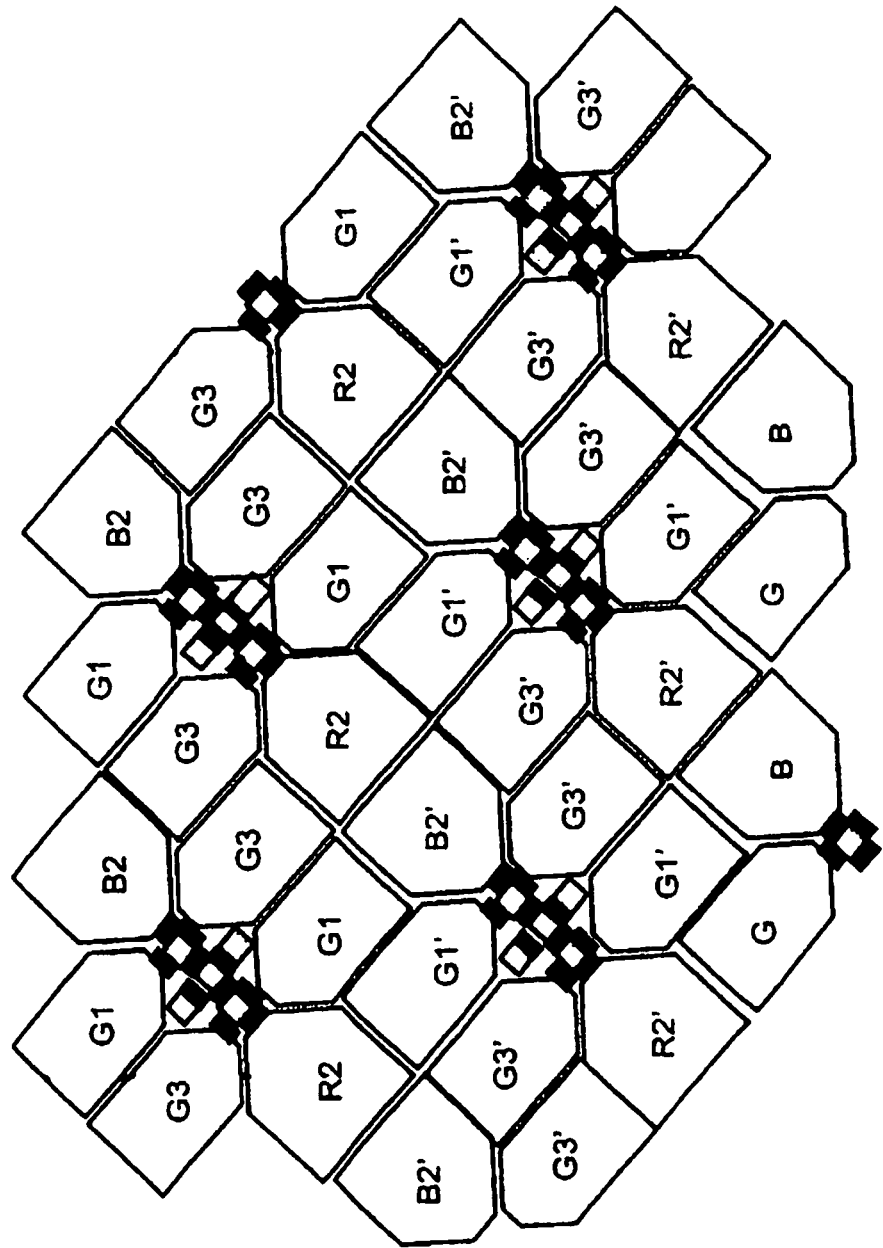
FIG. 12 is a plan view illustrating a pattern layout of a solid-state imaging device according to other embodiment of the present invention.

FIG. 12 is a plan view illustrating a pattern layout of a solid-state imaging device according to still another embodiment of the present invention. The pattern layout of this solid-state imaging device is a layout obtained by rotating the 12-pixel 1-cell repetition block illustrated in FIG. 5 by 45°. Numbers 1, 2, 3, 1', 2', and 3' are added to characters R, G, and B indicating color of color filters to express reading out order of the pixels. The reading of the pixels is performed in a manner that four pixels (OS1, OS2, OS3, and OS4) are readout by two output circuits adjacent in a horizontal direction, each of which reads out two pixels. As readout information, 1', 2', and 3' are added, in addition to conventional 1, 2, and 3, as in FIG. 12.

While the embodiments of the invention have been described, these are intended merely as illustrative examples, and the scope of the invention is not limited thereto. For example, the 6-pixel 1-cell illustrated in FIG. 2 may be simply arranged in a square lattice shape in vertical and horizontal directions, and spaces between the structures may be sufficiently secured by extending PDs. Further, the number of photodiodes constituting the first or second unit cell may be more than three.

These embodiments may be embodied in various other forms, and various omissions, substitutions, and modifications may be made without departing from the spirit and scope of the invention. In particular, the arrangement of color filters or combination of read pixels may be variously changed.

Rather, such embodiments and modifications are included in the scope and spirit of the present invention and fall within the invention defined by the following claims and its equivalents.

What is claimed is:

1. A solid-state imaging device including a first unit cell and a second unit cell to form a basic cell, a circuit pattern layout of each of the first unit cell and the second cell comprising:
   at least three photodiodes configured to convert incident light into signal charges and accumulate the signal charges;
   a transfer gate provided adjacent to each of the at least three photodiodes and configured to read signal charges from the photodiodes;
   a floating junction configured to receive the signal charges from the at least three photodiodes through the transfer gate and generate variations in potentials;
   a reset gate provided adjacent to the floating junction and configured to reset the potential of the floating junction to a constant potential; and
   a reset drain provided adjacent to the reset gate;
   wherein the at least three photodiode regions are provided on one side of a line symmetric axis passing through the reset drain, and
   wherein the first unit cell and the second unit cell are arranged in a symmetric relation and the reset drain of the two unit cells is shared.

2. The solid-state imaging device according to claim 1, wherein a plurality of basic unit cells is arranged in a checkerboard pattern, so that at least one of the photodiodes of the first unit cell of a first basic cell may be disposed adjacent to one of the photodiodes of the second unit cell of a second basic cell, which is diagonally adjacent to the first basic cell.

3. The solid-state imaging device according to claim 1 further comprising amplifier transistors provided to detect the variations in potentials of the floating junctions, wherein element isolation is performed between each of the photodiodes and the output source electrodes of the amplifier transistors by shallow trench isolation (STI) process and the element isolation between the photodiodes is performed by forming impurity regions through an ion implantation process in the basic unit cell.

4. The solid-state imaging device according to claim 1, wherein a color filter configured to selectively transmit a specific color of light is formed on each of the photodiodes.

5. The solid-state imaging device according to claim 4, wherein there is no photodiode on a portion of the output circuit pattern included in a circuit pattern forming the basic cell, so that missing image signals are supplemented by image information of adjacent photodiodes of the same color.

6. The solid-state imaging device according to claim 2, further comprising:
transfer gate transistors each including the transfer gate, reset gate transistors each including the reset gate and reset drain and amplifier transistors provided to detect the variations in potentials of the floating junctions;
a transfer gate wiring connected in common to the transfer gate electrodes of the transfer gate transistors to read the charges accumulated in the photodiodes arranged in the same row included in each of basic cells arranged in a checkerboard pattern;
a reset wiring connected in common to the reset gate electrodes of the reset transistors arranged in the same row included in each of the basic cells; and
an output wiring connected in common to an output source electrode of the amplifier transistors included in one of two unit cells included in each of the basic cells.

7. The solid-state imaging device according to claim 2 further comprising reset transistors each including the reset gate and reset drain, wherein, in basic cells arranged in the same rows which include the reset transistors to which the reset wiring is connected in common, the reset wiring is also connected in common to reset gate electrodes of reset transistors included in basic cells arranged in adjacent rows.

8. The solid-state imaging device according to claim 2 further comprising reset transistors each including the reset gate and reset drain and transfer gate transistors each including the transfer gate, wherein, in basic cells arranged in the same rows which include the reset transistors to which reset wiring is connected in common, reset electrodes of the reset transistors are connected in common to the transfer gate wiring connected in common to transfer gate transistors included in basic cells arranged in adjacent rows so that the transfer gate wiring is shared by the reset wiring.

9. The solid-state imaging device according to claim 1, wherein a circuit pattern forming the basic cell is rotated by about 90° and disposed in a checkerboard pattern.

10. The solid-state imaging device according to claim 9, wherein there is no photodiode on a portion of the output circuit pattern included in the circuit pattern forming the basic cell, so that missing image signals are supplemented by image information of adjacent photodiodes of the same color.

11. The solid-state imaging device according to claim 1, wherein a circuit pattern forming the basic cell is rotated by about 45° and disposed in a square lattice shape.

12. The solid-state imaging device according to claim 11, wherein there is no photodiode on a portion of the output circuit pattern included in the circuit pattern forming the basic cell, so that missing image signals are supplemented by image information of adjacent photodiodes of the same color.

13. A solid-state imaging device including a first unit cell and a second unit cell to form a basic cell, each of the first unit cell and the second cell comprising:
at least three photodiodes configured to convert incident light into signal charges and accumulate the signal charges;
transfer gate transistors configured to read signal charges from the photodiodes;
floating junctions configured to receive the signal charges from the transfer gate transistors and generate variations in potentials;
amplifier transistors provided to detect the variations in potentials of the floating junctions and having a gate electrode, a drain electrode, and an output source electrode; and reset transistors provided to reset the potentials of the floating junctions to a constant potential and having a source electrode as the floating junction, a reset gate electrode, and a reset drain electrode forming a power source unit to specify a constant potential,
wherein each of the floating junctions and the reset drain electrodes of the reset transistors is formed in a rectangular pattern, and transfer gate electrodes of the transfer gate transistors are disposed adjacent to three sides of the rectangular pattern forming the floating junction,
three photodiodes are disposed on opposite sides of the floating junctions of the transfer gate electrodes one by one, the reset transistor electrode of the reset transistor is disposed adjacent to the remaining side of the floating junction, the reset drain electrode having the rectangular pattern is disposed on opposite sides of the floating junctions of the gate electrode, and the gate electrode of the amplifier transistor is disposed adjacent to one side of the reset drain electrode having the rectangular pattern,
the output source electrode of the amplifier transistor is disposed on an opposite side of the reset drain electrode of the gate electrode, and the three photodiodes are read in a common output circuit including the floating junctions, the reset transistor, and the amplifier transistor, and
the reset drain electrode of the reset transistor and the drain electrode of the amplifier transistor are shared, and
wherein the basic cell is formed by rotating the second unit cell by 180° about the reset drain electrode so that the first unit cell and the second unit cell are arranged in a miller symmetric relation and the reset drain electrode of the two unit cells is shared to form the basic cell including six photodiodes.

14. The solid-state imaging device according to claim 13, wherein element isolation is performed between each of the photodiodes and the output source electrodes of the amplifier transistors by shallow trench isolation (STI) process, and the element isolation between the photodiodes is performed by forming impurity regions through an ion implantation process in the basic cell.

15. The solid-state imaging device according to claim 14, wherein a color filter configured to selectively transmit a specific color of light is formed on each of the photodiodes.

16. The solid-state imaging device according to claim 13, wherein a plurality of basic cells is arranged in a checkerboard pattern.

17. The solid-state imaging device according to claim 16, wherein there is no photodiode on a portion of the output circuit pattern included in a circuit pattern forming the basic cell, so that missing image signals are supplemented by image information of adjacent photodiodes of the same color.

18. The solid-state imaging device according to claim 16, further comprising:
a transfer gate wiring connected in common to the transfer gate electrodes of the transfer gate transistors to read the charges accumulated in the photodiodes arranged in the same row included in each of basic cells arranged in a checkerboard pattern;
a reset wiring connected in common to the reset gate electrodes of the reset transistors arranged in the same row included in each of the basic unit cells; and
an output wiring connected in common to an output source electrode of the amplifier transistors included in one of two unit cells included in each of the basic cells.

19. The solid-state imaging device according to claim 18, wherein, in basic cells arranged in the same rows which include the reset transistors to which the reset wiring is connected in common, the reset wiring is also connected in common to reset gate electrodes of reset transistors included in basic cells arranged in adjacent rows.

20. The solid-state imaging device according to claim 18, wherein, in basic cells arranged in the same rows which include the reset transistors to which the reset wiring is connected in common, the reset electrodes of the reset transistors are connected in common to the transfer gate wiring connected in common to transfer gate transistors included in basic cells arranged in adjacent rows so that the transfer gate wiring is shared by the reset wiring.

\* \* \* \* \*